United States Patent [19]

Galburt

[11] Patent Number: 4,952,858
[45] Date of Patent: Aug. 28, 1990

[54] MICROLITHOGRAPHIC APPARATUS

[76] Inventor: Daniel N. Galburt, 520 Belden Hill Rd., Wilton, Conn. 06897

[21] Appl. No.: 198,545

[22] Filed: May 18, 1988

[51] Int. Cl.⁵ ............................................. G05F 1/00
[52] U.S. Cl. ................................... 318/647; 318/567; 318/653
[58] Field of Search ................................ 318/560–561, 318/567–571, 575–577, 638–640, 646, 647, 652–653, 649, 135; 378/132–133; 310/51

[56] References Cited

U.S. PATENT DOCUMENTS

| Re. 27,289 | 2/1972 | Sawyer | 318/38 |
|---|---|---|---|
| Re. 27,436 | 7/1972 | Sawyer | 318/38 |
| 3,789,285 | 1/1974 | Nishizawa | 318/687 |
| 3,889,164 | 6/1975 | Nishizawa et al. | 318/640 |
| 3,935,486 | 1/1976 | Nagashima | 310/12 |
| 4,019,109 | 4/1977 | McCoy et al. | 318/640 |
| 4,087,729 | 5/1978 | Yamazaki et al. | 318/601 |
| 4,443,743 | 4/1984 | Forys et al. | 318/115 |
| 4,485,339 | 11/1984 | Trost | 318/640 |
| 4,506,204 | 3/1985 | Galburt | 318/653 |
| 4,506,205 | 3/1985 | Trost et al. | 318/653 |
| 4,507,597 | 3/1985 | Trost | 318/653 |
| 4,675,891 | 6/1987 | Plessis et al. | 378/132 |
| 4,677,651 | 6/1987 | Hartl et al. | 378/133 |
| 4,687,980 | 8/1987 | Phillips et al. | 318/640 |
| 4,698,575 | 10/1987 | Bouwer | 318/640 |
| 4,742,286 | 5/1988 | Phillips | 318/640 |

Primary Examiner—William M. Shoop, Jr.
Assistant Examiner—David S. Martin
Attorney, Agent, or Firm—Thomas P. Murphy; Edwin T. Grimes

[57] ABSTRACT

This invention is directed to electro-magnetic alignment apparatus which includes a monolithic stage, a sub-stage, an isolated reference structure, force actuators interposed between the monolithic stage and the sub-stage for suspending and positioning the monolithic stage in space, sensors for sensing the position of the monolithic stage and outputting a signal to control circuitry, which compares the sensed position with a commanded stage position and outputs an error signal to the force actuator, and actuators for controlling the position of the sub-stage to follow the approximate position of the monolithic stage.

17 Claims, 2 Drawing Sheets

MICROLITHOGRAPHIC APPARATUS

FIELD OF INVENTION

This invention relates to microlithographic instruments and more particularly to electro-magnetic alignment apparatus which is particularly adapted, among other possible uses, for use in aligning the wafer in a microlithography system.

BACKGROUND OF THE INVENTION

My own patent No. 4,506,204 shows electro-magnetic alignment apparatus which includes at least three magnet assemblies mounted in spaced relationship, at least three coil assemblies mounted to pass through the high flux region of the magnet assemblies, means for connecting the coil assemblies to form a rigid structure, and means for controlling the supply of current to the coils so that the structure can be moved selectively in three degrees of freedom. My present contribution to the art is a new alignment apparatus, which is an improvement over such known systems.

SUMMARY OF THE INVENTION

In brief, the present invention contemplates the provision of an electro-magnetic alignment apparatus which includes a monolithic stage, a sub-stage, an isolated reference structure, force actuators interposed between the monolithic stage and the sub-stage for suspending and positioning the monolithic stage in space, control means for controlling the position of the monolithic stage, sensors mounted between the isolated reference structure and the monolithic stage for sensing the position of the monolithic stage and outputting a signal to the control means. The control means is constructed and arranged to compare the sensed position of the monolithic stage with a commanded stage position and output an error signal to the force actuators. The apparatus further includes means for controlling the position of the sub-stage to follow the approximate position of the monolithic stage.

In one form of the invention, the force actuators include a coil component mounted on the sub-stage and a separate non-contacting magnet structure mounted on the monolithic stage.

According to one aspect of the invention, the sensors include laser gage sensors for three degrees of freedom and short range non-contact electro-optical sensors for three different degrees of freedom of the monolithic stage.

According to another aspect of the invention, the means for controlling the position of the sub-stage includes at least two separate non-contact sensors, and two linear servo motors operatively responsive to the non-contact sensors.

According to still another aspect of the invention, the control means are constructed and arranged to provide an acceleration feed forward signal which combines with the sensed position signal to output a modified control signal to the force actuators. The control means are also constructed and arranged to provide an acceleration feed forward signal which combines with the signals from the non-contact sensors to output a modified control signal to the linear servo motors.

Problems limiting the performance of existing stage designs of the prior art are avoided including, low resonant frequencies, large magnetic structures, and reaction load disturbances in critical structures. Advantages of the invention include, higher accuracy, modular design, lower cost, smaller, less weight, and does not require the use of air bearings.

There has thus been outlined rather broadly the more important features of the invention in order that the detailed description thereof that follows may be better understood, and in order that the present contribution to the art may be better appreciated. There are, of course, additional features of the invention which will be described more fully hereinafter. Those skilled in the art will appreciate that the conception on which this disclosure is based may readily be utilized as a basis for the design of other apparatus for carrying out the several purposes of the invention. It is most important, therefore, that this disclosure be regarded as including such equivalent apparatus as do not depart from the spirit and scope of the invention.

Several embodiments of the invention have been chosen for purposed of illustration and description and are shown in the accompanying drawings, forming a part of the specification.

DETAILED DESCRIPTION OF A PRESENTLY PREFERRED EMBODIMENT

Figure 1:
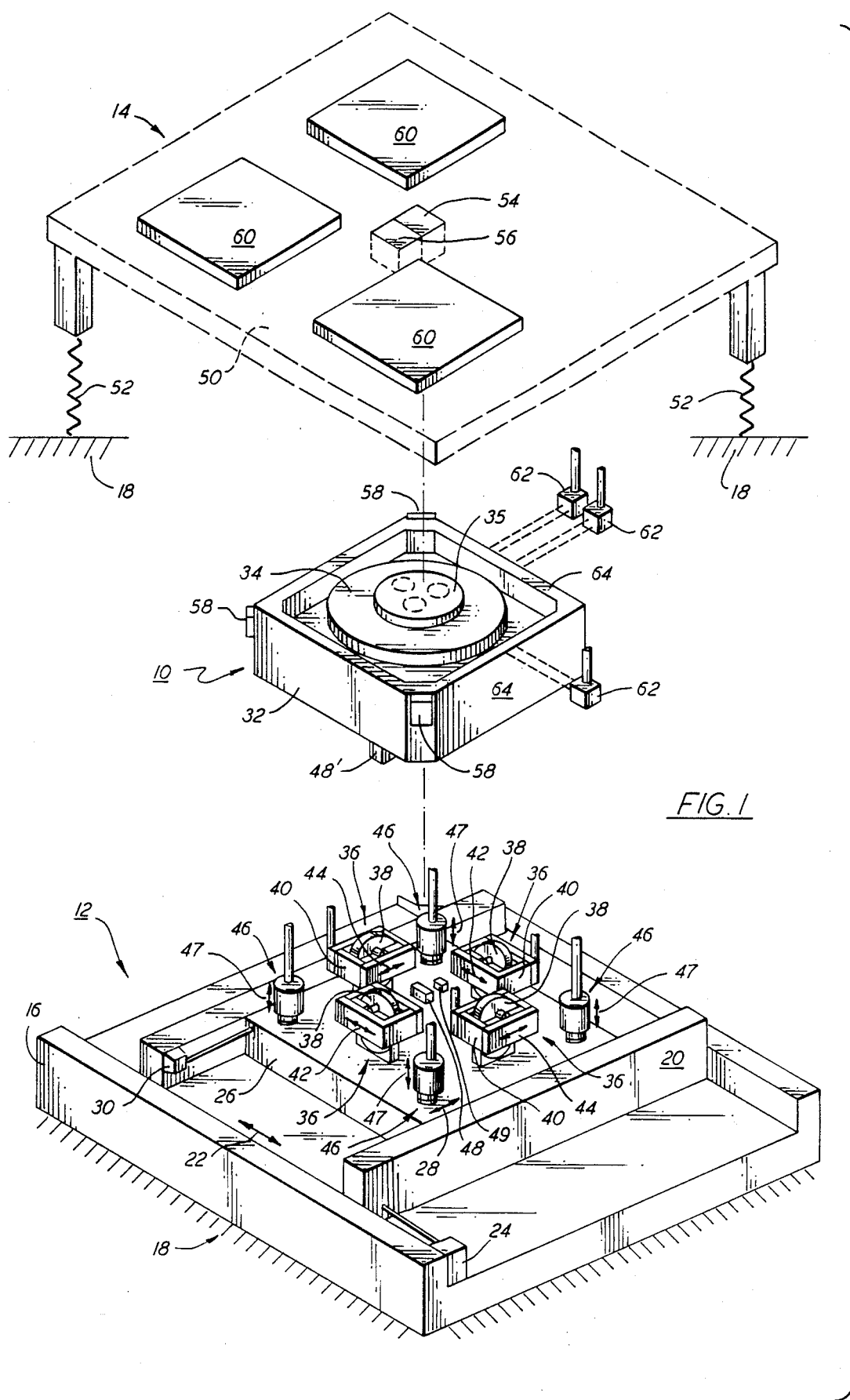
FIG. 1 is an exploded perspective view of electromagnetic alignment apparatus constructed according to the concepts of the present invention.

In the embodiment of the invention illustrated, the new and improved electro-magnetic alignment devise comprises a monolithic stage 10, an X-Y sub-stage 12 and an isolated reference structure 14, as shown in FIG. 1.

The X-Y sub-stage 12 is a conventional X-Y mechanically guided sub-stage, which is servo driven to follow the approximate position of the monolithic stage. It could employ anti-friction bearings such as, for example, ball bearings or roller bearings as ways. Air bearings could also be used, but they are unnecessary. As a result the instrument could operate in a vacuum, if desired. Actually the entire alignment device could be arranged to operate in a vacuum for some installations, if desired.

As best seen in FIG. 1 the sub-stage 12 includes a base plate 16 mounted on the ground, as indicated at 18, and a movable frame 20. The frame 20 is movable back and forth in the X direction, as indicated by arrow 22, by means of a linear servo motor 24. A deck member 26 is mounted on the frame 20 for back and forth movement in the Y direction, as indicated by arrow 28, by means of a linear servo motor 30 provided for the purpose. Other suitable drive mechanisms could be employed instead of the linear servo motors 24 and 30 such as, for example, ball screws, rotary motors or the equivalent. The bearings and drive means for the sub-stage 12 does not have to be very precise. It just has to be capable of reasonable acceleration velocities. As a result it can be relatively inexpensive and more compact than would be necessary if a planar force motor was employed, for example.

As seen in FIG. 1, the monolithic stage 10 includes a block member 32, which carries a wafer chuck 34, that supports a wafer 35. This compact, precision, monolithic stage is suspended in space with its position controlled in six degrees of freedom by high performance servos using short stroke, non-contact electro-magnetic force actuators. Four flat coil actuators, indicated at 36, are provided each of which include a flat coil component 38 mounted on the X-Y sub-stage 12 and a separate non-contacting high strength permanent magnet 40 mounted on the monolithic stage 10. While it is presently preferred to mount the coil component 38 on the X-Y sub-stage 12 and the magnet 40 on the monolithic stage 10 to reduce the heat dissipation and the number of wires attached to the monolithic stage, it would also be acceptable to reverse these elements. While FIG. 1 illustrates four flat coil actuators, it would be possible to operate with a minimum of three such actuators. These actuators provide for movement of the monolithic stage 10 in three degrees of freedom. That is, two actuators provide for movement in the X direction as indicated by arrows 42 and the other two actuators provide for movement in the Y direction as indicated by arrows 44. The monolithic stage is caused to rotate by driving all of the actuators simultaneously.

Four voice coil type focus actuators, indicated at 46, are provided, each of which include a cylindrical coil component mounted on the X-Y sub-stage 12 and a separate non-contacting high strength permanent magnet mounted on the monolithic stage 10. As is the case with the flat coil actuators, it is preferable to mount the coil component on the X-Y sub-stage 12 and the magnet on the monolithic stage 10, but it is also possible to reverse these elements. While it is possible to employ a minimum of three focus actuators, four is preferable. These focus actuators 46 provide an additional three degrees of freedom to the monolithic stage 10 as illustrated by the arrows 47. That is, the monolithic stage can be tilted as desired by the selection of the particular pair of actuators activated. If all four actuators are activated at the same time the monolithic stage can be raised or lowered with respect to the X-Y sub-stage. The clearance between the two stages is generally maintained at a range of the order of about 1/32 inch. The use of flat coil and voice coil-type actuators as described is desirable because this configuration facilitates assembly and disassembly. That is, the monolithic stage can literally be lifted off the sub-stage along the "Z" axis. An all voice coil configuration is also practical.

Any misalignment between the monolithic stage 10 and the sub-stage 12 is measured by non-contact sensor assemblies, two being indicated at 48 near the center of the sub-stage and their mating portions being indicated at 48' on the underside near the center of the monolithic stage. Two individual sensors or one combined sensor can be use to measure the X and Y positions. The output of these sensors is electronically amplified and fed back to the servo motors 24 and 30 to cause the sub-stage 12 to approximately follow the motion of the monolithic stage 10 and maintain alignment of the force actuators, as will be described more fully hereinafter. Any suitable type of non-contact short range sensors may be used such as a solid state emitter and split photodiode detector, a capacitance gage, or an LVDT, for example. The X-Y distance or position of the sub-stage with respect to the monolithic stage is what is important. The vertical distance or angular relationship between the two stages does not need to be sensed by these sensors.

Although it appears geometrically that the monolithic stage is mounted on the sub-stage, in operation, the monolithic stage is actually floating in space above the sub-stage, with its position controlled by the electro-magnetic force of the actuators. As long as the actuator coils remain in the magnetic field of their associated magnet structures, and do not contact those structures, then the position of the monolithic stage is unaffected by the position of the sub-stage.

In some installations, to prevent overheating of the actuators, it is desirable to counterforce the dead weight of the monolithic stage. This can be accomplished by using centrally disposed permanent magnets in either attracting or repelling modes between the monolithic stage and the sub-stage, as indicated at 49, FIG. 1.

The instrument can be operated with extended motion in a vertical plane. The use of a counterforce device on the vertical axis of the sub-stage may be necessary in some installations.

The isolated reference structure 14 comprises a support member 50, which is mounted on the ground 18 by means of isolators or springs 52. The support member carries an imaging optical system 54 and outer loop focus sensors 56. A number of different imaging optical systems could be employed such as, an exposing tool, an inspection tool or an electron beam, for example. When the instrument is being used to expose wafers for the semiconductor industry, a separate set of sensors 56 are mounted near the imaging optics 54, which look at several points directly on the surface of the wafer 35. These sensors are used to follow the wafer surface, which may not be flat. These sensors provide fine measurement, but they do not need to be as fast as the inner loop sensors which will be described hereinafter. Any suitable type of non-contact sensor may be employed sure as air gages, a cap gage or other type of optic sensor, for example.

The instrument is provided with at least three inner loop electro-optical focus sensors 58 mounted on the corners of the monolithic stage 10 and three corresponding flats 60 mounted on the underside of the support number 50. The tilt position of the monolithic stage is sensed by these short range, non-contact, electro-optical sensors in three degrees of freedom. In one design a beam is reflected off the mirror surface of the flats 60, and if the mirror moves closer or away a signal moves on a little cell to thereby sense small motion changes between the corners of the monolithic stage and the three flats. Other suitable types of sensors could be used such as a cap gage, for example.

At least three laser gage plane mirror interferometers 62 are used to sense the position of the monolithic stage 10 in three degrees of freedom, X-Y and theta. The laser gages 62 depend from the support number 50 to a location adjacent the sides 64 of the block member 32. The sides 64 form mirrors by virtue of reflective coatings or by actual mirrors being mounted thereon. That is, the interferometers direct beams onto the sides to sense the X-Y and theta motion of the monolithic stage. Theta is a measure of the rotation in the plane.

It will be appreciated that the performance of the instrument depends on the laser gage interferometers, short range sensor reference flats, and imaging optical assemblies being mounted on a common isolated structure, thereby preventing stage reaction loads from disturbing these critical components.

Figure 2:
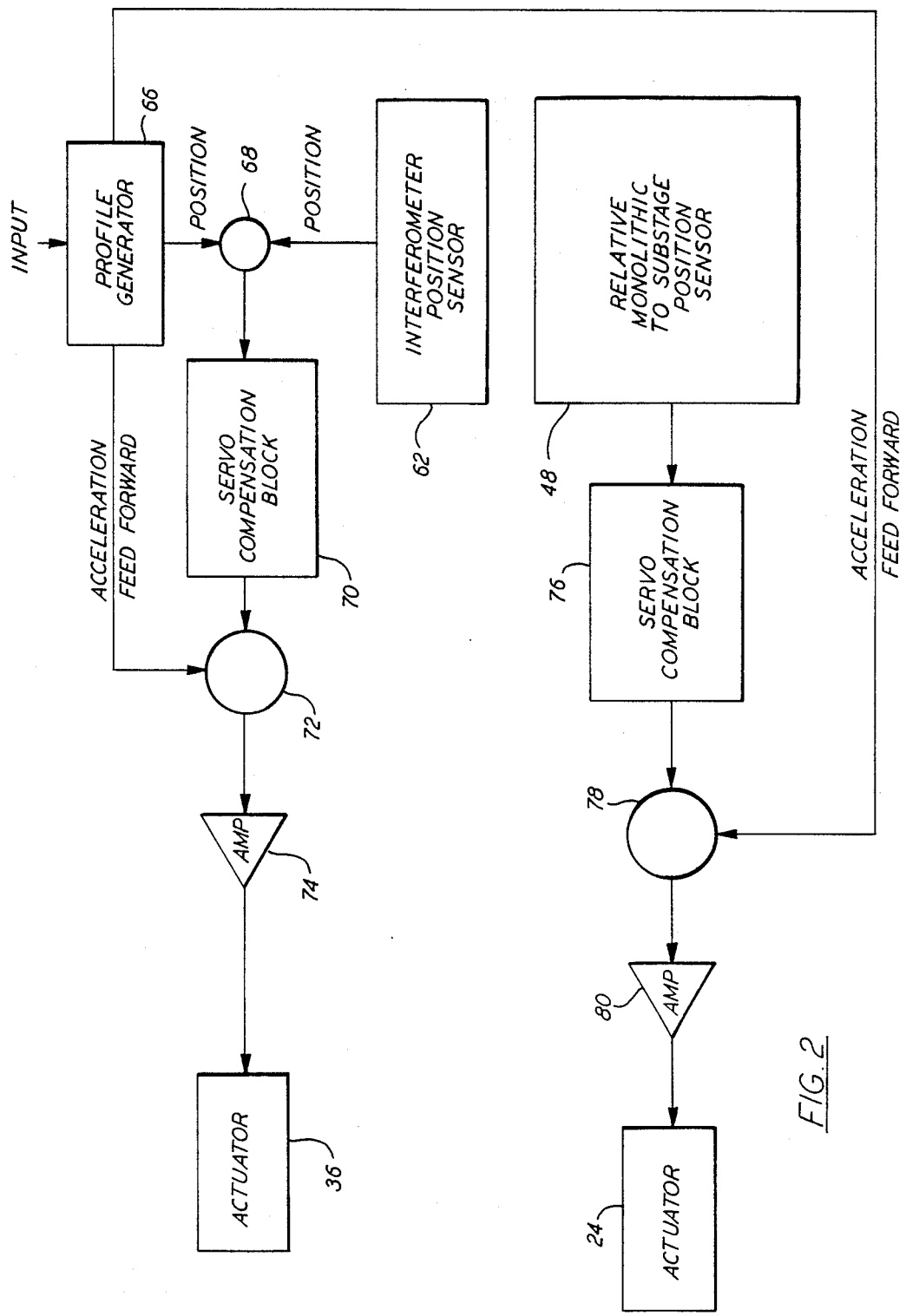
FIG. 2 is a block diagram of the controls for the apparatus shown in FIG. 1.

In essence the position of the monolithic stage is electronically compared with a computer commanded stage position. The resultant error is amplified and fed back to the actuators. FIG. 2 shows this in more detail. One of the six degree systems is illustrated for purposes of clarity; ie the X system. A computer or profile generator 66 is used. The profile generator or commander is programed to know in advance the X-position where the monolithic stage is supposed to be. A summing junction 68 receives an X-position signal from the profile generator 66 and from the interferometer position sensor 62. The error output from the summing junction 68 passes through a servo compensation block 70 to a summing junction 72. The servo compensation block serves as an electrical network stabilizing system. A signal corresponding to the acceleration and feed forward position is outputted from the profile generator 66 to the summing junction 72. The output from the summing junction 72 passes through amplifier means 74 to drive the actuator 36.

Still referring to FIG. 2, the signal from the sensor assembly 48 is directed through a servo compensation block 76 to a summing junction 78. The servo compensation block 76 serves as an electrical network stabilizing system similar to the compensation block 70. An acceleration and feed forward position signal from the profile generator 66 is also directed to the summing junction 78. The output from this summing junction is passed through amplifier means 80 to the linear servo motor actuator 24.

In a similar manner all of the actuators are controlled by their respective sensors in combination with signals from the profile generator to position the monolithic stage as well as the sub-stage.

It will thus be seen that the present invention does indeed provide a new and improved microlithographic instrument wherein the position of the monolithic stage is unaffected by vibration in the sub-stage, thereby permitting the sub-stage to be of a lower cost design, mounted without isolation from ground vibration. All the reaction loads from both the monolithic stage and the sub-stage are transmitted directly to the ground, and therefore do not disturb the isolated structure to which the position of the monolithic stage is electro-optically referenced.

Although certain particular embodiments of the invention are herein disclosed for purposes of explanation, further modifications thereof, after study of this specification, with be apparent to those skilled in the art to which the invention pertains. Reference should accordingly be had to the appended claims in determining the scope of the invention.

What is claimed is:

1. Electro-magnetic alignment apparatus comprising, in combination:
a monolithic stage, a sub-stage, an isolated reference structure, means mounted on said sub-stage for magnetically suspending and positioning said monolithic stage, means mounted on said isolated reference structure for sensing the position of said monolithic stage and outputting a corresponding signal to said means for suspending said monolithic stage and means for controlling the position of said sub-stage to follow the approximate position of said monolithic stage.

2. Electro-magnetic alignment apparatus according to claim 1 wherein said means for suspending said monolithic stage includes means for providing said monolithic stage with six degrees of freedom and means for controlling the position of said monolithic stage in the six degrees of freedom.

3. Electro-magnetic alignment apparatus according to claim 2 wherein said means for controlling the position of said sub-stage includes means for providing said sub-stage with three degrees of freedom and means for controlling the position of said sub-stage in the three degrees of freedom.

4. Electro-magnetic alignment apparatus according to claim 1 wherein said means for suspending said monolithic stage includes electro-magnetic force actuators.

5. Electro-magnetic alignment apparatus according to claim 4 wherein each of said electro-magnetic force actuators includes a coil component mounted on said sub-stage and a separate non-contacting magnet structure mounted on said monolithic stage.

6. Electro-magnetic alignment apparatus according to claim 2 wherein said means for sensing the position of said monolithic stage includes laser gage sensors for three degrees of freedom and short range non-contact electro-optical sensors for three different degrees of freedom.

7. Electro-magnetic alignment apparatus according to claim 3 wherein said means for controlling the position of said sub-stage includes at least two separate non-contact sensors, and two linear servo motors operatively responsive to said non-contact sensors.

8. Electro-magnetic alignment apparatus according to claim 7 wherein said monolithic stage includes means for mounting a semiconductor wafer thereon and said isolated reference structure includes means for mounting imaging optics thereon, and wherein a set of sensors are mounted on said isolated reference structure adjacent said imaging optics to look at the surface of the wafer for adjusting said imaging optics.

9. Electro-magnetic alignment apparatus comprising, in combination:
a monolithic stage, a sub-stage, an isolated reference structure, means mounted on said sub-stage for magnetically suspending and positioning said monolithic stage, control means for controlling the position of said monolithic stage, means mounted on said isolated reference structure for sensing the position of said monolithic stage and outputting a corresponding signal to said control means, said control means including means for comparing the sensed position of said monolithic stage with a commanded stage position and outputting an error signal to said means for positioning said monolithic stage, and means for controlling the position of said sub-stage to follow the approximate position of said monolithic stage.

10. Electro-magnetic alignment apparatus comprising, in combination:
a monolithic stage, a sub-stage, an isolated reference structure, means mounted on said sub-stage for magnetically suspending and positioning said monolithic stage, control means for controlling the position of said monolithic stage, means mounted on said isolated reference structure for sensing the position of said monolithic stage and outputting a corresponding signal to said control means, said control means including means for comparing the sensed position of said monolithic stage with a commanded stage position and outputting an error signal to said means for positioning said monolithic stage, and means for controlling the position of said sub-stage to follow the approximate position of said monolithic stage, said control means further including a profile generator, a first summing junction for receiving a position signal from said means for sensing the position of said monolithic stage and from said profile generator and for outputting a signal, a second summing junction for receiving said output signal from the first summing junction and for receiving an acceleration feed forward signal from said profile generator and for outputting a signal to said means for positioning said monolithic stage.

11. Electro-magnetic alignment apparatus according to claim 10 wherein said means for controlling the position of said sub-stage includes at least two separate non-contact sensors and two linear servo motors, and wherein said control means includes a summing junction for receiving output from said non-contact sensors and for receiving a second acceleration feed forward signal from said profile generator and for outputting a signal to said servo motors.

12. Electro-magnetic alignment apparatus according to claim 11 wherein said means for suspending said monolithic stage includes electro-magnetic force actuators.

13. Electro-magnetic alignment apparatus according to claim 9, wherein said monolithic stage includes means for mounting a semiconductor wafer thereon and said isolated reference structure includes means for mounting imaging optics thereon, and wherein a set of sensors are mounted on said isolated reference structure adjacent said imaging optics to look at the surface of the wafer for adjusting said imaging optics.

14. An isolated precision positioning stage comprising:
 a sub-stage movable in a first plane;
 sub-stage sensor means for detecting the position of said sub-stage;
 magnetic force actuators mounted on said sub-stage and movable in a second plane substantially parallel to said first plane;
 focus actuators mounted on said sub-stage;
 a monolithic stage magnetically coupled to said magnetic force actuators and said focus actuators whereby said monolithic stage is magnetically suspended above said sub-stage;
 misalignment sensors, associated with said sub-stage and said monolithic stage, for detecting the relative misalignment therebetween; and
 follower means, associated with said misalignment sensor and said sub-stage, for causing said sub-stage to approximately follow the motion of said monolithic stage.

15. An isolated precision positioning stage as in claim 14 wherein:
 said sub-stage is movable in two orthogonal axes.

16. An isolated position precision positioning stage as in claim 15 wherein:
 said monolithic force actuators are movable in two orthogonal axes.

17. An isolated position positioning stage at as in claim 16 further comprising:
 monolithic stage sensors for detecting the position of said monolithic stage in relation to an isolated reference.

* * * * *